(12) United States Patent
Inoue et al.

(10) Patent No.: US 10,830,823 B2
(45) Date of Patent: Nov. 10, 2020

(54) ESTIMATION DEVICE AND ESTIMATION METHOD

(71) Applicant: GS Yuasa International Ltd., Kyoto (JP)

(72) Inventors: Tomoshige Inoue, Kyoto (JP); Kenichi Sejima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 460 days.

(21) Appl. No.: 15/469,438

(22) Filed: Mar. 24, 2017

(65) Prior Publication Data

US 2017/0285110 A1    Oct. 5, 2017

(30) Foreign Application Priority Data

Apr. 1, 2016 (JP) ................................. 2016-074454
May 16, 2016 (JP) ................................. 2016-097948

(51) Int. Cl.
*G01R 31/374* (2019.01)
*G01R 31/367* (2019.01)

(52) U.S. Cl.
CPC ......... *G01R 31/374* (2019.01); *G01R 31/367* (2019.01)

(58) Field of Classification Search
None
See application file for complete search history.

(56) References Cited

U.S. PATENT DOCUMENTS

| | | | | |
|---|---|---|---|---|
| 6,057,688 A * | 5/2000 | Kawai | ................ | G01R 31/3648 324/428 |
| 6,586,940 B2 * | 7/2003 | Asakura | ................... | H02M 3/07 324/426 |
| 8,587,254 B2 | 11/2013 | Kobayashi et al. | | |
| 2002/0105303 A1 | 8/2002 | Kishi et al. | | |
| 2007/0046263 A1 * | 3/2007 | Matsushima | ......... | H02J 7/0047 320/132 |
| 2012/0310571 A1 | 12/2012 | Takagi | | |
| 2014/0107956 A1 * | 4/2014 | Miyaki | .................. | B60L 58/16 702/63 |
| 2016/0377686 A1 | 12/2016 | Uchida et al. | | |
| 2017/0074943 A1 | 3/2017 | Tao | | |

FOREIGN PATENT DOCUMENTS

| | | |
|---|---|---|
| JP | 2002-236154 A | 8/2002 |
| JP | 2012-055092 A | 3/2012 |
| JP | 5382208 B2 | 1/2014 |
| JP | 5466564 B2 | 4/2014 |
| JP | 2014-081238 A | 5/2014 |
| JP | 2015-026478 A | 2/2015 |
| JP | 2015-154534 A | 8/2015 |
| JP | 2015-191859 A | 11/2015 |
| WO | WO 2015/141500 A1 | 9/2015 |

* cited by examiner

*Primary Examiner* — Nasima Monsur
(74) *Attorney, Agent, or Firm* — McGinn I.P. Law Group, PLLC.

(57) ABSTRACT

Provided is an estimation device for estimating an actual capacity of an energy storage device or a total reduction amount of the actual capacity. The estimation device includes a processor which is configured to calculate the actual capacity of the energy storage device or the total reduction amount of the actual capacity based on approximation data where a capacity change curve indicative of a transition of the actual capacity or a transition of the total reduction amount of the actual capacity with respect to an elapsed time is approximated by a plurality of straight lines.

18 Claims, 17 Drawing Sheets

| REDUCTION AMOUNT Y OF ACTUAL CAPACITY C PER UNIT TIME [Ah/month] | | TEMPERATURE [°C] | | |
|---|---|---|---|---|
| | | 0 | 25 | 50 |
| DIVIDED AREA | E1 (TOTAL REDUCTION AMOUNT: 0 TO 3Ah) | 0.5241 | 2.3623 | 8.4343 |
| | E2 (TOTAL REDUCTION AMOUNT: 3 TO 6Ah) | 0.1747 | 0.7874 | 2.8114 |
| | E3 (TOTAL REDUCTION AMOUNT: 6 TO 9Ah) | 0.1048 | 0.4725 | 1.6869 |

FIG. 7

| PERIOD (MONTH) | TEMPERATURE [°C] |
|---|---|
| 1 | 0 |
| 2 | 25 |
| 3 | 25 |
| 4 | 25 |
| 5 | 50 |

FIG. 9

| ELAPSING CONDITION | | REDUCTION AMOUNT Y [Ah] | TOTAL REDUCTION AMOUNT ΣY [Ah] | RANGE OF TOTAL REDUCTION AMOUNT |
|---|---|---|---|---|
| PERIOD [MONTH] | TEMPERATURE [°C] | | | |
| 0 | — | — | 0.00 | E1 (0 TO 3Ah) |
| 1 | 0 | 0.5241 | 0.5241 | E1 (0 TO 3Ah) |
| 2 | 25 | 2.3623 | 2.8864 | E1 (0 TO 3Ah) |
| 3 | 25 | 2.3623 | 5.2487 | E2 (3 TO 6Ah) |
| 4 | 25 | 0.7874 | 6.0361 | E3 (6 TO 9Ah) |
| 5 | 50 | 1.6869 | 7.7230 | E3 (6 TO 9Ah) |

FIG. 10

| RATIO BETWEEN REDUCTION AMOUNTS Y OF ACTUAL CAPACITY C PER UNIT TIME | | TEMPERATURE [°C] |
|---|---|---|
| | | 25 |
| DIVIDED AREA | E1 (TOTAL REDUCTION AMOUNT: 0 TO 3Ah) | 1.0000 |
| | E2 (TOTAL REDUCTION AMOUNT: 3 TO 6Ah) | 0.3333 |
| | E3 (TOTAL REDUCTION AMOUNT: 6 TO 9Ah) | 0.2000 |

FIG. 11

| REDUCTION AMOUNT Y OF ACTUAL CAPACITY C PER UNIT TIME [Ah/month] | | TEMPERATURE [°C] | | |
|---|---|---|---|---|
| | | 0 | 25 | 50 |
| DIVIDED AREA | E1 (TOTAL REDUCTION AMOUNT: 0 TO 3Ah) | 0.5241 | 2.3623 | 8.4343 |

FIG. 13

| | SOC [%] | | |
|---|---|---|---|
| | 60 | 80 | 100 |
| CORRECTION COEFFICIENT | $\alpha 1$ | $\alpha 2$ | $\alpha 3$ |

(HERE, $\alpha 1 < \alpha 2 < \alpha 3$)

FIG. 17

| TEMPERATURE [°C] | COEFFICIENT |
|---|---|
| 15 | k1 |
| 20 | k2 |
| 25 | 1 |
| 30 | k3 |
| 35 | k4 |
| 40 | k5 |
| 45 | k6 |
| 50 | k7 |
| 55 | k8 |
| 60 | k9 |

FIG. 19

| RANGE OF TOTAL REDUCTION AMOUNT ΣY | CORRESPONDING APPROXIMATION STRAIGHT-LINE | GRADIENT d OF APPROXIMATION STRAIGHT-LINE |
|---|---|---|
| $0 \leq \Sigma Y < e1$ | D1 | d1 |
| $e1 \leq \Sigma Y < e2$ | D2 | d2 |
| $e2 \leq \Sigma Y < e3$ | D3 | d3 |

ESTIMATION DEVICE AND ESTIMATION METHOD

CROSS-REFERENCE TO RELATED APPLICATIONS

This application claims the benefit of Japanese patent applications No. 2016-074454 filed on Apr. 1, 2016 and No. 2016-097948 filed on May 16, 2016 which are incorporated by reference.

Field

The present invention relates to a technique for estimating an actual capacity of an energy storage device or a total reduction amount of the actual capacity.

Background

It has been known that, in a lithium ion secondary battery, an actual capacity (a capacity which can be taken out from a state where the secondary battery is completely charged) gradually decreases from an initial value with time. It is not easy to measure an actual capacity of a battery during a period in which the battery is in use and hence, there has been a demand for the estimation of an actual capacity using measurable parameters. As main factors which cause reduction of an actual capacity of a battery, there are cycle degradation which is brought about by repetition of charging and discharging of the battery and the degradation of the battery with a lapse of time after the battery is manufactured. As a method of estimating the reduction of an actual capacity caused by the degradation of the battery with a lapse of time, estimation methods which use a square-root law and an Arrhenius law are known. The square-root law is a law where an actual capacity is lowered in proportion to a square-root of an elapsed time. Japanese Patent No. 5382208 discloses a technique for estimating a degradation ratio of a battery using a square-root law. The Arrhenius law is a law where a degree of lowering of an actual capacity differs depending on a temperature.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In estimating an actual capacity or a total reduction amount of an actual capacity of an energy storage device using a square-root law, it is necessary to perform a square-root calculation. Accordingly, it is necessary to mount a CPU having a high arithmetic operation ability, and an arithmetic operation load also becomes large. A secondary battery having a characteristic where an actual capacity or a total reduction amount of the actual capacity follows a predetermined curve has a similar problem.

Is an object of the present invention to provide an estimation device and an estimation method for estimating an actual capacity of an energy storage device or a total reduction amount of the actual capacity by a simple arithmetic operation.

According to an aspect of the present invention, there is provided an estimation device for estimating an actual capacity of an energy storage device or a total reduction amount of the actual capacity, wherein the estimation device includes a processor which is configured to calculate the actual capacity or the total reduction amount of the actual capacity based on approximation data where a capacity change curve indicative of a transition of the actual capacity or a transition of the total reduction amount of the actual capacity with respect to an elapsed time is approximately by a plurality of straight lines.

The estimation device can estimate the actual capacity of the energy storage device or a total reduction amount of the actual capacity by a simple arithmetic operation.

BRIEF DESCRIPTION OF DRAWINGS

The foregoing and other features of the present invention will become apparent from the following description and drawings of an illustrative embodiment of the invention in which:

FIG. 6 is a view showing a capacity reduction amount map MA.

FIG. 7 is a view showing temperature data on secondary batteries.

FIG. 9 is a view showing an estimation example of a total reduction amount of an actual capacity of the secondary batteries.

FIG. 10 is a view showing first data in an embodiment 2.

FIG. 11 is a view showing second data.

FIG. 13 is a view showing correction data applied to a fourth embodiment.

FIG. 17 is a view showing coefficients corresponding to respective battery temperatures.

FIG. 19 is a view showing data on gradients of respective approximation straight lines.

Figure 1:
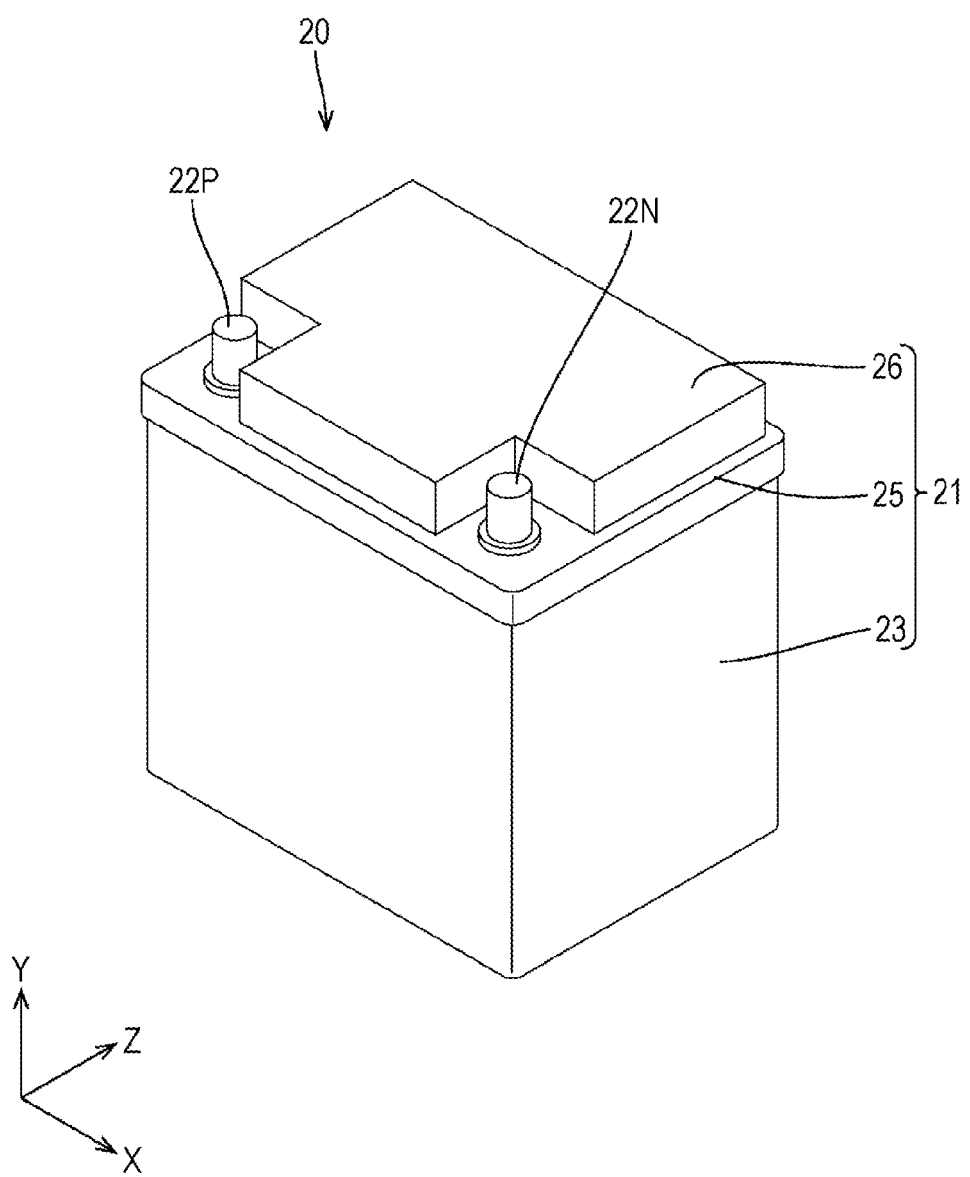
FIG. 1 is a perspective view of a battery module used in an embodiment 1.

DESCRIPTION OF EMBODIMENTS (Overall Configuration of this Embodiment)

First, the overall configuration of an estimation device disclosed in this embodiment is described.

According to an aspect of the embodiment, there is provided an estimation device for estimating an actual capacity of an energy storage device or a total reduction amount of the actual capacity, wherein the estimation device includes a processor which is configured to calculate the actual capacity or the total reduction amount of the actual capacity based on approximation data where a capacity change curve indicative of a transition of the actual capacity or a transition of the total reduction amount of the actual capacity with respect to an elapsed time is approximated by a plurality of straight lines.

With such a configuration, the capacity change curve is approximated by the straight lines and hence, in calculating the actual amount or the total reduction amount of the actual capacity, for example, a square-root calculation becomes unnecessary. Therefore an arithmetic operation load of the processor can be suppressed.

According to another aspect of the embodiment, the capacity change curve may be approximated by the straight lines in a form where the capacity change curve is divided into a plurality of areas. The plurality of areas formed by dividing the capacity change curve may be areas obtained by partitioning the actual capacity or the total reduction amount of the actual capacity by a predetermined value. In this embodiment, it is unnecessary to count and hold a total elapsed time of elapsed times and hence, the actual capacity and the total reduction amount of the actual capacity can be easily calculated.

According to still another aspect of the embodiment, the capacity change curve may be provided for respective temperatures of the energy storage device. The processor may be configured to calculate the actual capacity or the total reduction amount of the actual capacity based on approximation data where the capacity change curves which correspond to the respective temperatures of the energy storage device are approximated by a plurality of straight lines. With such a configuration, the capacity change curve is provided for respective temperatures in accordance with an Arrhenius law and hence, the actual capacity or the total reduction amount of the actual capacity can be estimated accurately without based on a temperature change.

According to still another aspect of the embodiment, a gradient of the straight line which approximates the capacity change curve may express the reduction amount of the actual capacity per unit time. The estimation device may include a memory part which holds a capacity reduction amount map expressing a reduction amount of an actual capacity per unit time with respect to respective areas obtained by dividing the capacity change curve and the respective battery temperatures. With such a configuration, the reduction amount of the actual capacity per unit time can be obtained with respect to the respective battery temperatures by looking up the capacity reduction amount map.

According to still another aspect of the embodiment, the processor may be configured to calculate the reduction amount of the actual capacity per a predetermined time of the energy storage device based on data on a temperature of the energy storage device and the capacity reduction amount map each time a predetermined time elapses after the manufacture of the energy storage device. The processor may be configured to calculate a present value of the actual capacity by subtracting the reduction amount of the actual capacity per the predetermined time from a previous-time value of the actual capacity or calculates a present value of a total reduction amount of the actual capacity by adding the reduction amount of the actual capacity per the predetermined time to a previous-time value of the total reduction amount of the actual capacity.

With such a configuration, the present value of the actual capacity can be calculated by subtracting the reduction amount of the actual capacity per the predetermined time from the previous-time value of the actual capacity. Alternatively, the total reduction amount of the actual capacity can be obtained by obtaining the reduction amount of the actual capacity and by adding the reduction amount of the actual capacity per the predetermined time to the previous-time value of the total reduction amount of the actual capacity. That is, the actual capacity and the total reduction amount of the actual capacity can be obtained by simple calculation.

According to still another aspect of the embodiment, a gradient of the straight line which approximates the capacity change curve may express a reduction amount of the actual capacity per unit time, and the estimation device may include a memory part which holds: first data indicative of a ratio of the reduction amount of the actual capacity per unit time of the respective areas formed by dividing the capacity change curve; and second data indicative of the reduction amount of the actual capacity per unit time for respective battery temperatures in one region formed by dividing the capacity change curve. With such a configuration, the number of data to be held can be reduced compared to the capacity reduction amount map.

According to still another aspect of the embodiment, the processor may be configured to calculate the reduction amount of the actual capacity of the energy storage device per a predetermined time based on data on a temperature of the energy storage device, the first data and the second data each time a predetermined time elapses after the manufacture of the energy storage device. The processor may be configured to calculate a present value of the actual capacity by subtracting the reduction amount of the actual capacity per the predetermined time from a previous-time value of the actual capacity or calculates a present value of a total reduction amount of the actual capacity by adding the reduction amount of the actual capacity per the predetermined time to a previous-time value of the total reduction amount of the actual capacity.

With such a configuration, the present value of the actual capacity can be calculated by subtracting the reduction amount of the actual capacity per the predetermined time from the previous-time value of the actual capacity. Alternatively, the total reduction amount of an actual capacity can be obtained by obtaining the reduction amount of the actual capacity per the predetermined time and by adding the reduction amount of the actual capacity to the previous-time value of the total reduction amount of the actual capacity. That is, the actual capacity and the total reduction amount of the actual capacity can be obtained by simple calculation.

According to still another aspect of the embodiment, the processor may be configured to correct data on the reduction amount of the actual capacity per unit time based on an SOC of the energy storage device. With such a configuration, data on a reduction amount of an actual capacity per unit time is corrected corresponding to the SOC and hence, estimation accuracy of the actual capacity or the total reduction amount of the actual capacity can be enhanced.

According to still another aspect of the embodiment, based on gradients of a plurality of straight lines which approximate a capacity change curve of the energy storage device at a reference temperature, a temperature of the energy storage device, and a conversion time obtained by converting a time which elapses with the energy storage device held at the temperature into a time which elapses with the energy storage device held at the reference temperature, the processor may be configured to calculate the reduction amount of the actual capacity per the time at the temperature. With such a configuration, it is sufficient to hold data on the straight lines which approximate the capacity change curve only with respect to the reference temperature and it is unnecessary to hold data on other battery temperatures. Accordingly, the number of data to be held can be reduced.

According to still another aspect of the embodiment, the higher the temperature of the energy storage device, the longer the conversion time may become. With such a configuration, the higher the temperature of the energy storage device, the longer the conversion time becomes and hence, a calculated reduction amount of the actual capacity is increased. Accordingly, the reduction amount of the actual capacity due to a change in temperature can be accurately estimated.

The processor may be configured to calculate the conversion time by multiplying the time which elapses with the energy storage device held at the temperature by a coefficient which corresponds to the temperature. With such a configuration, it is possible to obtain the conversion time by a relatively simple arithmetic operation such as multiplication.

The embodiment is applicable to an estimation method or an estimation program for estimating an actual capacity or a total reduction amount of the actual capacity.

Embodiment 1

The embodiment 1 of the present invention is described with reference to FIG. 1 to FIG. 8.

1. Description of Battery Module

Figure 2:
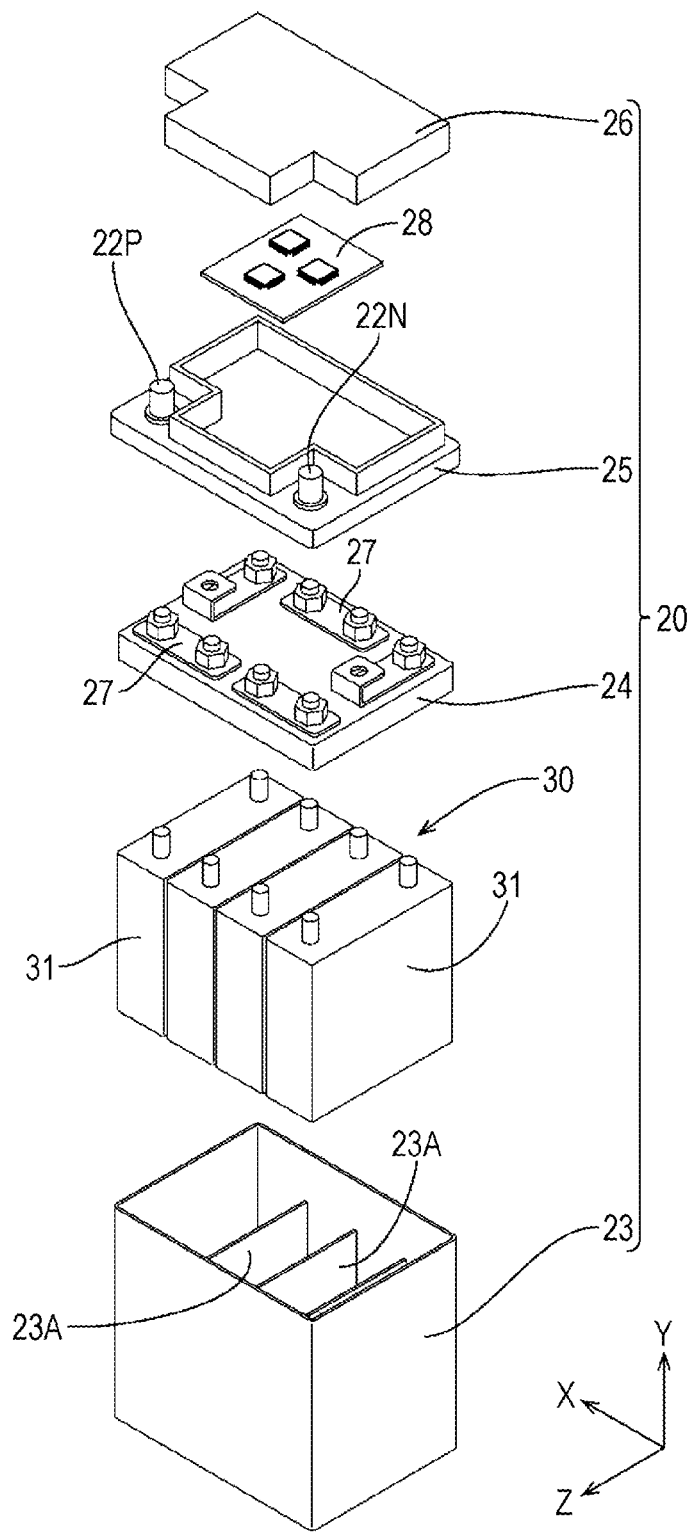
FIG. 2 is an exploded perspective view of the battery module.
Figure 3:
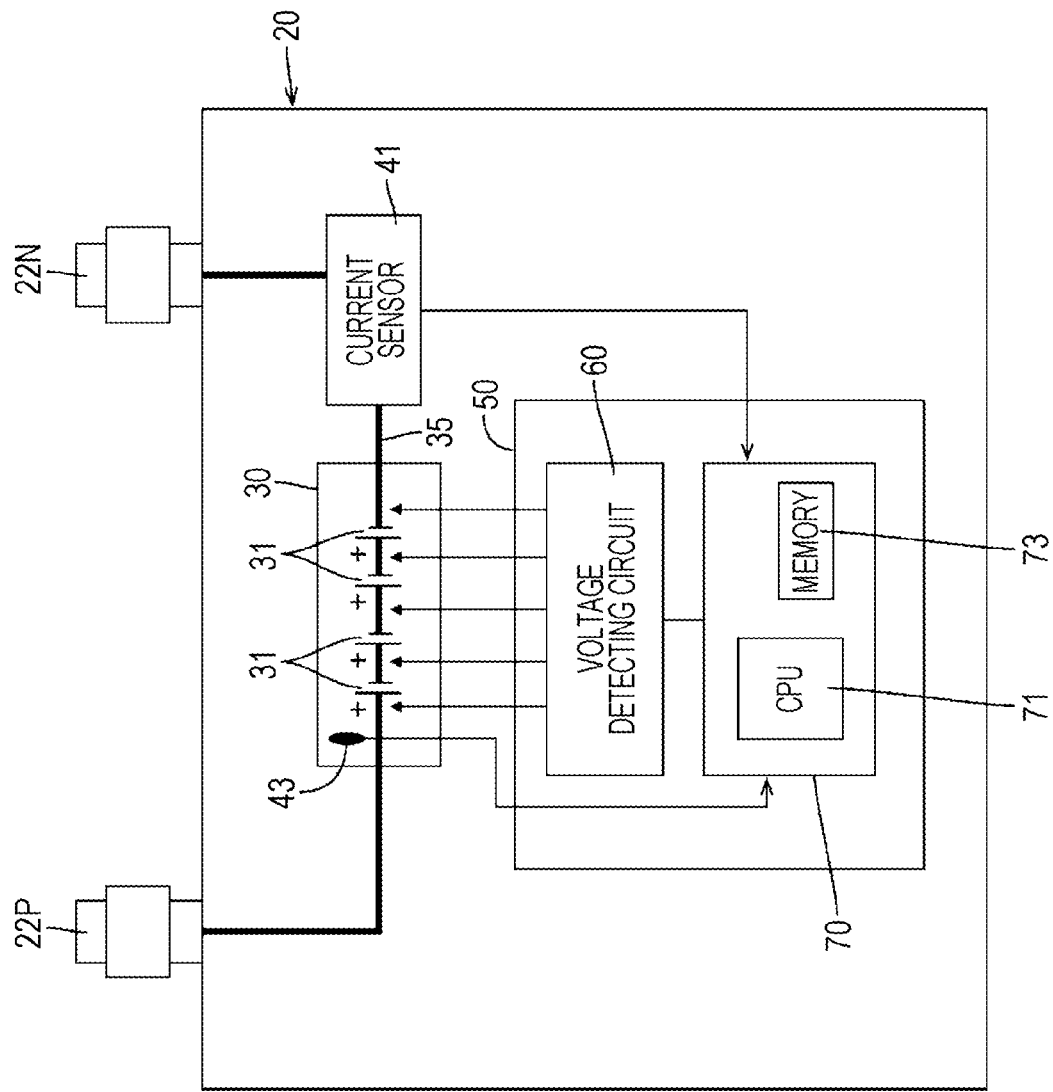
FIG. 3 is a block diagram showing the electrical configuration of the battery module.

FIG. 1 is a perspective view of a battery module, FIG. 2 is an exploded perspective view of the battery module, and FIG. 3 is a block diagram showing the electrical configuration of the battery module.

The battery module 20 includes a block-like battery case 21 as shown in FIG. 1. In the inside of the battery case 21, an assembled battery 30 formed of a plurality of secondary batteries 31 and a circuit board 28 are housed. In the description made hereinafter, in the case where FIG. 1 and FIG. 2 are referenced, the description is made by assuming a vertical direction of the battery case 21 when the battery case 21 is placed horizontally without a gradient with respect to the mounting surface as "Y direction", a direction which extends along a long side direction of the battery case 21 as "X direction" and a depth direction of the battery case 21 as "Z direction".

As shown in FIG. 2, the battery case 21 includes: a box-like case body 23 which opens upwardly; a positioning member 24 which positions the plurality of secondary batteries 31; an intermediate lid 25 mounted on an upper portion of the case body 23; and an upper lid 26 mounted on an upper portion of the intermediate lid 25. As shown in FIG. 2, a plurality of cell chambers 23A in each of which a secondary battery 31 is housed are arranged in the case body 23 in a row in the X direction.

As shown in FIG. 2, a plurality of bus bars 27 are disposed on an upper surface of the positioning member 24, and the positioning member 24 is disposed above the plurality of secondary batteries 31 disposed in the inside of the case body 23. With such a configuration, the plurality of secondary batteries 31 are positioned and are connected to each other in series by the plurality of bus bars 27.

As shown in FIG. 1, the intermediate lid 25 has an approximately rectangular shape as viewed in a plan view, and is also formed in a shape where height difference is made in the Y direction. On both end portions of the intermediate lid 25 in the X direction, a pair of terminal portions 22P, 22N to which harness terminals not shown in the drawing are connected is mounted. The pair of terminal portions 22P, 22N is made of metal such as a lead alloy, for example. Reference symbol 22P indicates the positive-electrode side terminal portion, and reference symbol 22N indicates the negative-electrode side terminal portion.

As shown in FIG. 2, the intermediate lid 25 is configured to house the circuit board 28 therein. When the intermediate lid 25 is mounted on the case body 23, the secondary batteries 31 and the circuit board 28 are connected to each other.

Next, the electrical configuration of the battery module 20 is described with reference to FIG. 3. The battery module 20 includes: the assembled battery 30; a current sensor 41; a temperature sensor 43; and a battery management device (hereinafter referred to as BM) 50 which manages the assembled battery 30. The assembled battery 30 is formed of a plurality of lithium ion secondary batteries (one example of "energy storage devices" of the present invention) 31 which are connected in series.

The current sensor 41 is connected to the assembled battery 30 in series through a connection line 35. The current sensor 41 is disposed in the inside of the battery case 21 and performs a function of detecting an electric current which flows into the secondary batteries 31. The temperature sensor 43 is of a contact type or a non-contact type and performs a function of measuring a temperature [° C.] of the secondary battery 31.

The current sensor 41 and the temperature sensor 43 are electrically connected to the BM 50 through signal lines. Detected values of the current sensor 41 and the temperature sensor 43 are received by the BM 50. The current sensor 41 is disposed in the inside of the battery case 21.

The BM 50 includes a voltage detecting circuit 60 and a control part 70, and is mounted on the circuit board 28. A power source line (not shown in the drawing) of the BM 50 is connected to the assembled battery 30. Electricity is supplied to the BM 50 from the assembled battery 30.

The voltage detecting circuit 60 is connected to both ends of the respective secondary batteries 31 through detection lines, and performs a function of measuring voltages of the respective secondary batteries 31 and a total voltage of the assembled battery 30 in response to an instruction from the control part 70.

The control part 70 includes: a CPU (one example of "processor" of the present invention) 71 which is a central processing unit; and a memory (one example of "memory part" of the present invention) 73. The CPU 71 monitors an electric current, a voltage and a temperature of each secondary battery 31 based on outputs from the current sensor 41, the voltage detecting circuit 60 and the temperature sensor 43, respectively. Further, as will be described later, the CPU 71 estimates a total reduction amount $\Sigma Y$ of an actual capacity C of the lithium ion secondary batteries 31.

The memory 73 is a non-volatile memory such as a flash memory or an EEPROM. In the memory 73, a monitoring program for monitoring the secondary batteries 31 and data necessary for executing these programs are stored. Besides these data, data on a capacity reduction amount map MA for estimating the total reduction amount $\Sigma Y$ of the actual capacity C of the secondary batteries 31 is also stored in the memory 73.

2. Straight Line Approximation of Capacity Change Curve

As main factors which cause lowering of the actual capacity C of the lithium ion secondary batteries 31, there are cycle degradation which is brought about by repetition of charging and discharging of the battery and the degradation of the battery with a lapse of time after the battery is manufactured. In this specification, "actual capacity C" is a capacity which can be taken out in a state where the secondary battery is completely charged. As a factor which causes the degradation of the battery with time, it is said that an SEI (Solid electrolyte interface) film formed on the negative electrode of the lithium ion secondary battery 31 grows and increases a thickness thereof along with a lapse of time after the battery is manufactured.

With respect to the degradation of the battery with time, there is an estimation method which uses a square-root law. The square-root law is a law where a total reduction amount $\Sigma Y$ of an actual capacity C changes in accordance with a root (for example, square root) of an elapsed time T. The term "elapsed time T" is a time elapsed from the manufacture of the battery.

Figure 4:
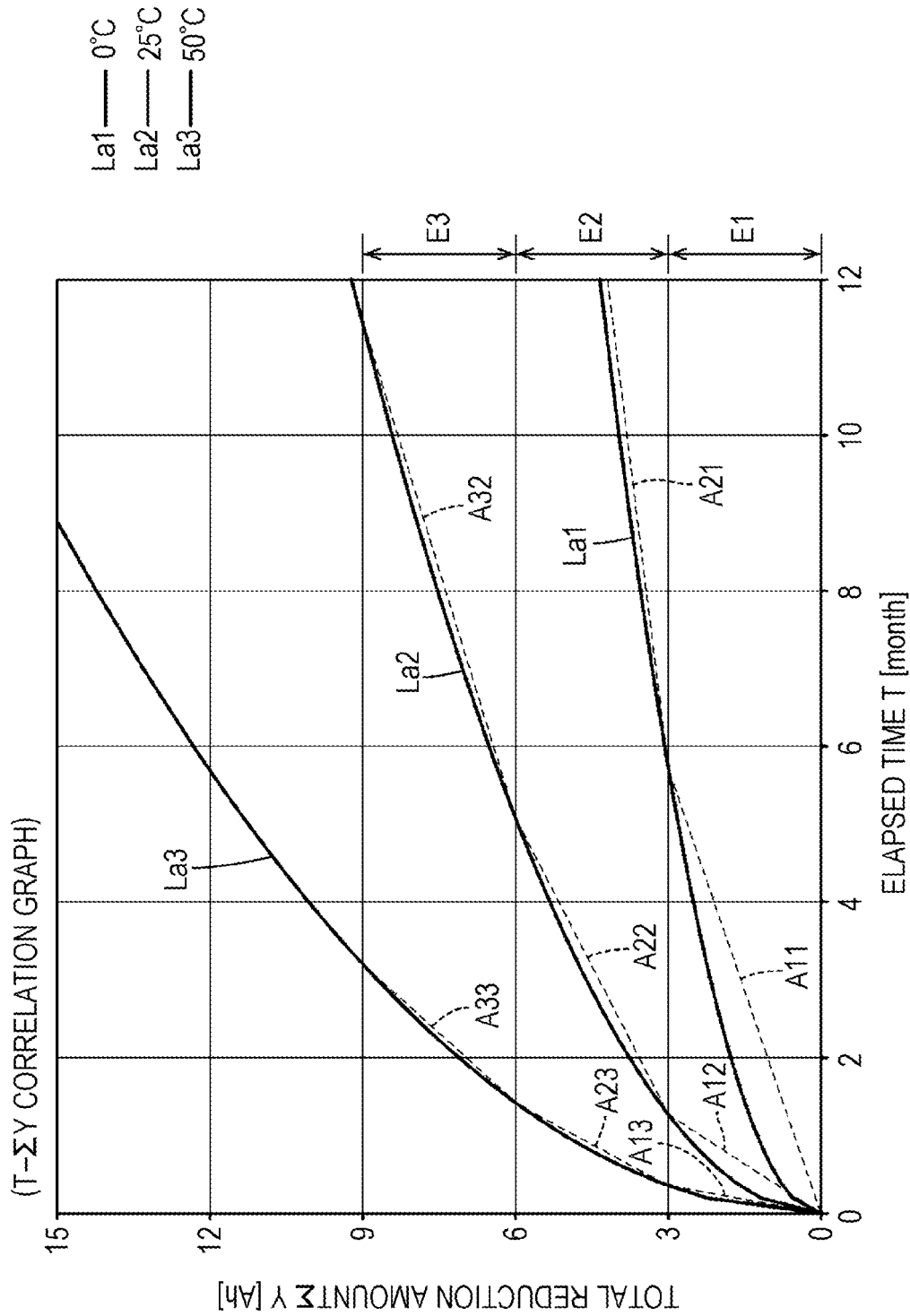
FIG. 4 is a graph showing a capacity change curve of a secondary battery.

FIG. 4 is a graph showing the transition of a total reduction amount $\Sigma Y$ of an actual capacity C with respect to the elapsed time T in the iron phosphate based lithium ion secondary battery 31. To be more specific, FIG. 4 is a T-$\Sigma Y$ correlation graph where the elapsed time T is taken on an axis of abscissas (X axis), and the total reduction amount $\Sigma Y$ of the actual capacity C is taken on an axis of ordinates (Y axis). A capacity change curve La indicative of the transition of the total reduction amount $\Sigma Y$ of the actual capacity C forms a root curve with respect to the elapsed time T.

The capacity change curve La is provided for each battery temperature. La1 indicates a capacity change curve when the battery temperature is 0[° C.], a La2 indicates a capacity change curve when the battery temperature is 25[° C.], and La3 indicates a capacity change curve when the battery temperature is 50[° C.].

These capacity temperature curves La1 to La3 are obtained by performing an experiment for checking the transition of a total reduction amount $\Sigma Y$ of an actual capacity C with a lapse of time after the manufacture of the battery with respect to the iron phosphate based lithium ion secondary battery 31 at respective battery temperatures. The iron phosphate based lithium ion secondary battery 31 is a battery in which lithium iron phosphate (LiFePO$_4$) is used as a positive active material and graphite is used as a negative active material.

In this embodiment, the capacity change curve La is approximated by straight lines by dividing the capacity change curve La into a plurality of areas E1 to E3. To be more specific, a total reduction amount $\Sigma Y$ is divided into three areas E1 to E3 by partitioning the total reduction amount $\Sigma Y$ for each predetermined value (3 [Ah] in this example) so that the capacity change curve La is approximated by the straight lines A1 to A3 for respective areas E1 to E3.

That is, the capacity change curve La1 is divided and approximated by three straight lines A11 to A31 which correspond to the respective areas E1 to E3. The capacity change curve La2 is divided and approximated by three straight lines A12 to A32 which correspond to the respective areas E1 to E3. The capacity change curve La3 is divided and approximated by three straight lines A13 to A33 which correspond to the respective areas E1 to E3.

The respective straight lines A1 to A3 which approximate the capacity change curve La can be obtained as a straight line which connects points P which respectively correspond to an upper limit value and a lower limit value of the corresponding region E of the capacity change curve La. For example, as shown in FIG. 5, in the case of the straight lines A11 to A13 which approximate a range which corresponds to the region E1, the straight lines A11 to A13 can be obtained as straight lines which connect an origin O which corresponds to a state where a total reduction amount of an actual capacity C is 0 [Ah] and the points P1 to P3 on the capacity change curves La1 to La3 which correspond to a state where the total reduction amount of the actual capacity C is 3 [Ah].

Figure 5:
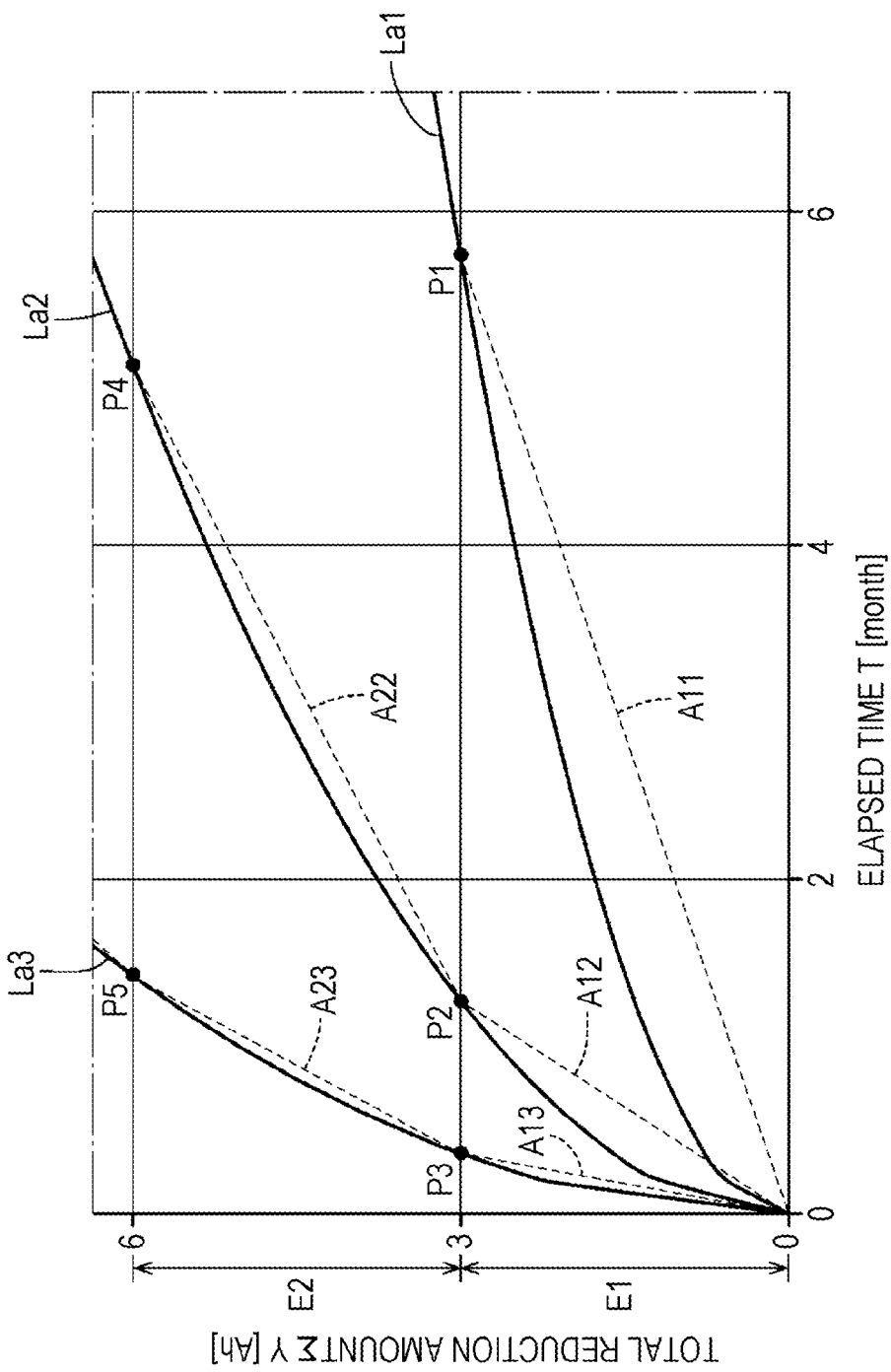
FIG. 5 is a graph showing a part of the graph shown in FIG. 4 in an enlarged manner.

Further, in the case of the straight line A22 which approximates a range of the capacity change curve La2 which corresponds to the region E2, as shown in FIG. 5, the straight line A22 can be obtained as a straight line which connects a point P2 of the capacity change curve La2 which corresponds to a total reduction amount of the actual capacity C of 3 [Ah] and a point P4 of the capacity change curve La2 which corresponds to a total reduction amount of the actual capacity C of 6 [Ah]. In the same manner, in the case of the straight line A23 which approximates a range of the capacity change curve La3 which corresponds to the region E2, as shown in FIG. 5, the straight line A23 can be obtained as a straight line which connects a point P3 of the capacity change curve La3 which corresponds to a total reduction amount of the actual capacity C of 3 [Ah] and a point P5 of the capacity change curve La3 which corresponds to a total reduction amount of the actual capacity C of 6 [Ah].

3. Capacity Reduction Amount Map MA and Estimation Processing of Total Reduction Amount $\Sigma Y$ Gradients of the respective straight lines A1 to A3 which divide the capacity change curve La respectively indicate a reduction amount Y of an actual capacity C per unit time (per one month in this example). In this embodiment, with respect to the respective capacity change curves La1 to La3, magnitudes of gradients of the respective straight lines A11 to A33 which approximate the respective capacity change curves La1 to La3 are obtained, and obtained results are formed into data as a capacity reduction amount map MA of the secondary batteries 31.

As shown in FIG. 6, in the capacity reduction amount map MA, a reduction amount Y of an actual capacity C per unit time is obtained for respective areas E1 to E3 based on which the capacity change curve La is divided and for respective battery temperatures. For example, when the battery temperature is 25[° C.], the reduction amounts Y of the actual capacities C per unit time in the respective areas E1 to E3 are 2.3623 [Ah/month], 0.7874 [Ah/month] and 0.4725 [Ah/month], respectively. These numerical values indicate magnitudes of gradients of three straight lines A12, A22, A32 which approximate the capacity change curve La2.

The battery module 20 holds in advance the data on the capacity reduction amount map MA shown in FIG. 6 in the memory 73 of the BM 50. The CPU 71 of the control part 70 performs processing for estimating a total reduction amount $\Sigma Y$ of an actual capacity C of the secondary batteries 31 brought about by the degradation with time based on data on a temperature of the secondary batteries and the capacity reduction amount map MA (processing in steps S10 to S30 in FIG. 8).

Figure 8:
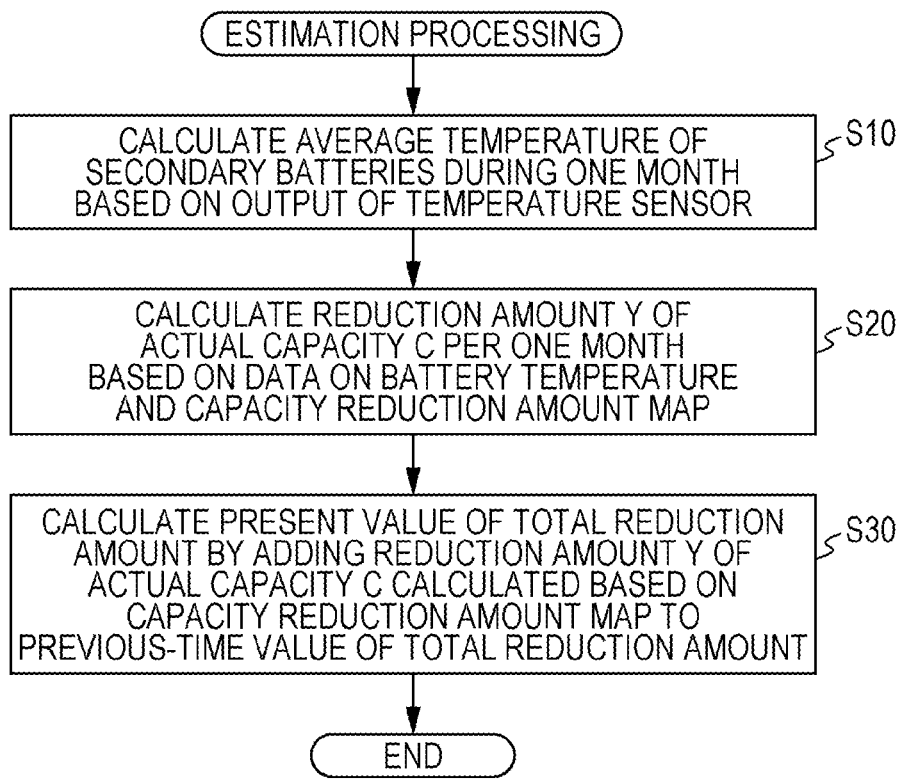
FIG. 8 is a flowchart showing the flow of estimation processing of a total reduction amount of an actual capacity of secondary batteries.

The estimation processing of the total reduction amount $\Sigma Y$ is, as shown in FIG. 8, formed of processing in steps S10 to S30. First, in step S10, after the battery is manufactured, each time a predetermined time (one month as an example) elapses, a processing of calculating an average temperature per a predetermined time (one month as an example) of the secondary batteries 31 is performed based on an output of the temperature sensor 43.

Then, in step S20, the processing is performed where a reduction amount Y of an actual capacity C per a predetermined time (one month as an example) of the secondary batteries 31 is calculated based on data on a battery temperature and a capacity reduction amount map MA. In step S30, by adding the reduction amount Y of the actual capacity C per the predetermined time (one month as an example) calculated based on the data on the battery temperature and the capacity reduction amount map MA to a previous value of a total reduction amount $\Sigma Y$, it is possible to calculate a present value of the total reduction amount $\Sigma Y$.

To be more specific, immediately after the battery is manufactured, a total reduction amount $\Sigma Y$ of an actual capacity C is 0 [Ah], and a zone of the total reduction amount $\Sigma Y$ of the secondary batteries 31 is included in the region E1. Accordingly, during a period until one month elapses from the manufacture of the battery, the reduction amount Y of the actual capacity C becomes any one of 0.5241 [Ah/month], 2.3623 [Ah/month] and 8.4343 [Ah/month].

FIG. 7 shows average temperatures of the secondary batteries 31 in respective months after the manufacture of the battery. In an example shown in the drawing, the average temperature of the secondary batteries 31 in the first month is 0[° C.]. Accordingly, in this case, a reduction amount of an actual capacity C per one month becomes 0.5241 [Ah/month], and a total reduction amount $\Sigma Y$ of an actual capacity C at a point of time that one month elapses from the manufacture of the battery becomes 0.5241 [Ah] as shown in FIG. 9.

When the total reduction amount $\Sigma Y$ of the actual capacity C at a point of time that one month elapses from the manufacture of the battery is 0.5241 [Ah], the zone of the total reduction amount $\Sigma Y$ of the secondary batteries 31 is included in the region E1 (0 to 3 [Ah]). Accordingly, during a period until one to two months elapse from the manufacture of the battery, the reduction amount of the actual capacity C per one month becomes any one of 0.5241 [Ah/month], 2.3623 [Ah/month] and 8.4343 [Ah/month].

In the example shown in FIG. 7, the average temperature of the secondary batteries 31 in the second month after the manufacture of the battery is 25[° C.]. Accordingly, in this case, in the second month after the manufacture of the battery, a reduction amount of an actual capacity C becomes 2.3623 [Ah/month]. Accordingly, a total reduction amount $\Sigma Y$ of an actual capacity C at a point of time that two months elapse after the manufacture of the battery becomes a numerical value obtained by adding the reduction amount Y of the actual capacity C in the second month to the total reduction amount $\Sigma Y$ of the actual capacity C at a point of time that one month elapses from the manufacture of the battery. That is, the total reduction amount $\Sigma Y$ of the actual capacity C becomes 2.8864 [Ah](=0.5241 [Ah]+2.3623 [Ah]) as shown in FIG. 9.

When the total reduction amount $\Sigma Y$ of the actual capacity C at a point of time that two months elapse from the manufacture of the battery is 2.8864 [Ah], the zone of the total reduction amount $\Sigma Y$ of the secondary batteries 31 is included in the region E1 (0 to 3 [Ah]). Accordingly, during a period until two to three months elapse from the manufacture of the battery, the reduction amount of the actual capacity C per one month becomes any one of 0.5241 [Ah/month], 2.3623 [Ah/month] and 8.4343 [Ah/month].

In the example shown in FIG. 7, the average temperature of the secondary batteries 31 in the third month after the manufacture of the battery is 25[° C.]. Accordingly, in this case, in the third month after the manufacture of the battery, a reduction amount Y of an actual capacity C per one month becomes 2.3623 [Ah/month]. Accordingly, a total reduction amount $\Sigma Y$ of an actual capacity C at a point of time that three months elapse after the manufacture of the battery becomes a numerical value obtained by adding the reduction amount Y of the actual capacity C in the third month to the total reduction amount $\Sigma Y$ of the actual capacity C at a point of time that two months elapse from the manufacture of the battery. That is, the total reduction amount $\Sigma Y$ of the actual capacity C becomes 5.2487 [Ah](=2.8864 [Ah]+2.3623 [Ah]) as shown in FIG. 9.

When the total reduction amount $\Sigma Y$ of the actual capacity C at a point of time that three months elapse from the manufacture of the battery is 5.2487 [Ah], the zone of the total reduction amount $\Sigma Y$ of the secondary batteries 31 is included in the region E2 (3 to 6 [Ah]). Accordingly, during a period until three to four months elapse from the manufacture of the battery, the reduction amount of the actual capacity C per one month becomes any one of 0.1747 [Ah/month], 0.7874 [Ah/month] and 2.8114 [Ah/month].

In the example shown in FIG. 7, the average temperature of the secondary batteries 31 in the fourth month after the manufacture of the battery is 25[° C.]. Accordingly, in this case, in the fourth month after the manufacture of the battery, a reduction amount Y of an actual capacity C per one month becomes 0.7874 [Ah/month]. Accordingly, a total reduction amount $\Sigma Y$ of an actual capacity C at a point of time that four months elapse after the manufacture of the battery becomes a numerical value obtained by adding the reduction amount Y of the actual capacity C in the fourth month to the total reduction amount $\Sigma Y$ of the actual capacity C at a point of time that three months elapse from the manufacture of the battery. That is, the total reduction amount $\Sigma Y$ of the actual capacity C becomes 6.0361 [Ah] (=5.2487 [Ah]+0.7874 [Ah]) as shown in FIG. 9.

As has been described heretofore, by adding a reduction amount of an actual capacity C per one month obtained based on the capacity reduction amount map MA to a total reduction amount $\Sigma Y$ up to the previous month, it is possible to obtain a present value of the total reduction amount $\Sigma Y$ of the actual capacity C.

In this embodiment, the capacity change curves La1 to La3 are approximated by using the plurality of straight lines A11 to A33 and hence, a square root calculation becomes unnecessary in calculating an actual capacity C or a total reduction amount $\Sigma Y$ of actual capacities C whereby an arithmetic operation load of the control part 70 can be suppressed.

In the embodiment 1, a capacity change curve La is divided in a Y axis direction. That is, a total reduction amount $\Sigma Y$ is divided based on areas E1 to E3 which are obtained by partitioning the total reduction amount $\Sigma Y$ with a predetermined value. With such a configuration, it is unnecessary to count and hold a total elapsed time of elapsed times T and hence, it is possible to acquire an advantageous effect that the total reduction amount $\Sigma Y$ of the actual capacity C can be easily calculated. That is, in the case where the capacity change curve La is divided in the X axis direction (in the case where the elapsed time T is divided by a predetermined value), it is necessary to count and hold the total elapsed time of the elapsed times T to obtain the total reduction amount ΣY of the actual capacity C. However, in this example, there is no such necessity at all.

Embodiment 2

Next, the embodiment 2 of the present invention is described with reference to FIG. 10 and FIG. 11.

In the embodiment 1, with respect to the respective capacity change curves La1 to La3, magnitudes of gradients of the respective straight lines A11 to A33 which approximate these capacity change curves La1 to La3 are respectively obtained, and obtained results are formed into data and are held in the form of the capacity reduction amount map MA of the secondary batteries 31.

In this specification, with respect to a reduction amount Y of an actual capacity C per unit time, a ratio K between the areas E to E3 becomes as follows when a battery temperature is 25[° C.]

Y1=2.3623, Y2=0.7874, Y3=0.4725

K=Y1:Y2:Y3="1.0000":"0.3333":"0.2000"

Y1 to Y3 are reduction amounts of an actual capacity C per unit time in the respective areas E1 to E3.

On the other hand, when the battery temperature is 0[° C.], the above-mentioned ratio K becomes "1.0000": "0.3333":"0.2000", while when the battery temperature is 50[° C.], the above-mentioned ratio K becomes "1.0000": "0.3333": "0.2000". In this manner, the ratio K between the reduction amounts Y1 to Y3 of the actual capacity C per unit time between the respective areas E1 to E3 becomes a fixed value regardless of a battery temperature.

In the second embodiment, by focusing on the characteristic of the battery that the ratio K between the reduction amounts Y1 to Y3 of the actual capacity C becomes approximately a fixed value regardless of a battery temperature, first data shown in FIG. 10 and second data shown in FIG. 11 are held in place of data on the capacity reduction amount map MA shown in FIG. 4. That is, although the data on the capacity reduction amount map MA shown in FIG. 4 is held in the memory 73 in the embodiment 1, the first data shown in FIG. 10 and the second data shown in FIG. 11 are held in the memory 73 in place of the capacity reduction amount map MA.

As shown in FIG. 10, the first data is data which expresses a ratio K between reduction amounts Y1 to Y3 of an actual capacity C per unit time with respect to the respective areas E1 to E3 based on which the capacity change curve La is divided. In this example, a numerical value at 25[° C.] is described as a representative value of the ratio K.

As shown in FIG. 11, second data is data which expresses a reduction amount Y of an actual capacity C per unit time for each battery temperature with respect to the region E1 (total reduction amount: 0 to 3 Ah) which is one region obtained by dividing the capacity change curve L.

In the case where the first data shown in FIG. 10 and the second data shown in FIG. 11 are held in the memory 73, by multiplying a reduction amount Y of an actual capacity C per unit time held in the memory 73 as shown in FIG. 11 by a ratio K between the respective areas, reduction amounts Y2, Y3 of the actual capacity C per unit time can be calculated also with respect to other areas E2, E3 which are not held in the memory 73 as shown in FIG. 11.

For example, when a battery temperature is 25° C., a reduction amount of an actual capacity C per unit time in the region E2 (Y2=0.7874) can be obtained by multiplying a reduction amount of an actual capacity C per unit time in the region E1 (Y1=2.3623) by a ratio of a reduction amount of an actual capacity C in the region E2 to the reduction amount of the actual capacity C in the region E1 (0.3333). A reduction amount of an actual capacity C per unit time in the region E3 (Y3=0.4725) can be obtained by multiplying a reduction amount of an actual capacity C per unit time in the region E1 (Y1=2.3623) by a ratio of a reduction amount of an actual capacity C in the region E3 to the reduction amount of the actual capacity C in the region E1 (0.2000).

Further, a ratio K between reduction amounts Y1 to Y3 of an actual capacity C between the respective areas E1 to E3 becomes substantially a fixed value regardless of a battery temperature. Therefore even when the battery temperature becomes a temperature other than 25[° C.] such as 0[° C.] or 50[° C.], reduction amounts Y2, Y3 of an actual capacity C per unit time can be calculated with respect to the respective areas E2, E3 based on which the capacity change curve La is divided by calculation substantially equal to the above-mentioned calculation method.

In the same manner as the embodiment 1, a total reduction amount ΣY of an actual capacity C is calculated also in the embodiment 2. In the embodiment 2, a reduction amount Y of an actual capacity C per a predetermined time is obtained using first data and second data, and a present value of the total reduction amount ΣY is calculated by adding the obtained reduction amount Y to a previous-time value of the total reduction amount ΣY.

In this manner, in the embodiment 2, the first data shown in FIG. 10 and the second data shown in FIG. 11 are held in the memory 73 in place of the capacity reduction amount map MA and hence, an amount of data to be held in the memory 73 can be reduced.

In the example described in the embodiment 1, the case is exemplified where the capacity change curve La has three kinds of temperature patterns La1 to La3. Further, the case is exemplified where the respective capacity change curves La1 to La3 are divided in three and are approximated by straight lines. As assuming a case where the capacity change curve La is divided in ten and the capacity change curve La has one hundred temperature patterns, it is necessary to hold "10×100" data as the capacity reduction amount map MA. In the configuration described in the embodiment 2, even when the capacity change curve La is divided in ten and the capacity change curve La has one hundred temperature patterns, it is sufficient to have only "10+100" data. That is, in this case, the number of data to be held in the memory 73 can be suppressed to approximately ⅑ of the number of data to be held in the memory 73 in the embodiment 1 and hence, an amount of data can be extremely effectively reduced.

Embodiment 3

Next, the embodiment 3 of the present invention is described with reference to FIG. 12.

In the embodiment 1, the case is exemplified where a total reduction amount ΣY of an actual capacity C in accordance with elapsing of an elapsed time T is calculated. In the embodiment 3, an actual capacity C in accordance with elapsing of an elapsed time T is calculated.

Figure 12:
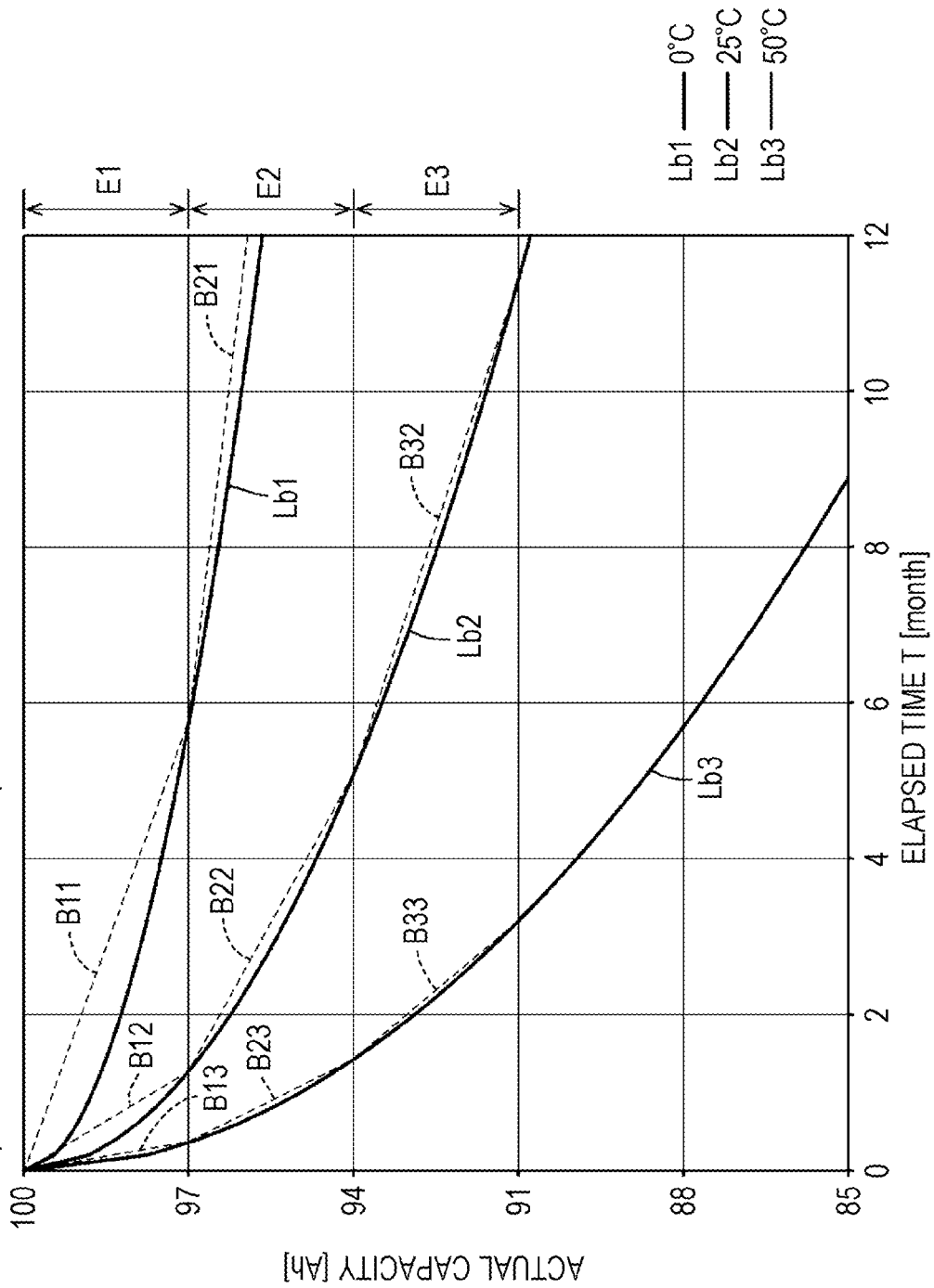
FIG. 12 is a graph showing a capacity change curve of secondary batteries applied to a third embodiment.

FIG. 12 is a T-C correlation graph with respect to an iron phosphate based lithium ion secondary battery 31. An elapsed time T is taken on an axis of abscissas (X axis) and an actual capacity C is taken on an axis of ordinates (Y axis). As shown in FIG. 12, a capacity change curve Lb which expresses the transition of an actual capacity C is a curve obtained by inverting the capacity change curve La shown in FIG. 4 in a folded manner with respect to the X axis, and is a square-root curve with respect to the elapsed time T in the same manner as the capacity change curve La.

As shown in FIG. 12, the capacity change curve Lb can be approximated in a state where the capacity change curve Lb is divided based on a plurality of areas E1 to E3 in the same manner as the capacity change curve La. In the example shown in FIG. 12, the capacity change curve Lb1 is divided and approximated by three straight lines B11 to A31 which correspond to the respective areas E1 to E3. The capacity change curve Lb2 is divided and approximated by three straight lines B12 to A32 which correspond to the respective areas E1 to E3. The capacity change curve Lb3 is divided and approximated by three straight lines B13 to B33 which correspond to the respective areas E1 to E3.

Due to such a configuration, in the same manner as the embodiment 1, with respect to the respective capacity change curves Lb1 to Lb3, magnitudes of gradients of the respective straight lines B11 to B33 which approximate the capacity change curves Lb1 to Lb3 are respectively obtained, and an obtained result is formed into data as a capacity reduction amount map MB of secondary batteries 31. Accordingly, it is possible to calculate a reduction amount Y of an actual capacity C per a predetermined time using the capacity reduction amount map MB. Then, a present value of the actual capacity C can be calculated by subtracting the calculated reduction amount Y of the actual capacity C from a previous-time value of the actual capacity C.

Embodiment 4

Next, the embodiment 4 of the present invention is described with reference to FIG. 13. There may be a case where a reduction amount Y of an actual capacity C per unit time differs depending on an SOC (State of charge) of lithium ion secondary batteries 31. By taking into account such a case, in the embodiment 4, processing is performed where a reduction amount Y of an actual capacity C per a predetermined time (one month) is corrected based on a value of an SOC of the secondary batteries 31.

To be more specific, in the embodiment 4, in addition to the capacity reduction amount map MA shown in FIG. 4, correction data shown in FIG. 13 is stored in the memory 73 in advance. The correction data is data which is stored by making a correction coefficient α correspond to an SOC of the secondary batteries 31. Assuming that an elapsed time T is the same, a reduction amount Y of an actual capacity C tends to be decreased as an SOC of the secondary batteries 31 is lowered. Accordingly, a magnitude relationship of correction coefficients becomes α1<α2<α3 as shown in FIG. 13.

The control part 70 calculates a reduction amount Y of an actual capacity C with respect to respective months after the manufacture of the battery by looking up the capacity reduction amount map MA in the same manner as the embodiment 1. Further, the control part 70 performs processing of calculating an average value of SOCs with respect to the respective months after the manufacture of the battery. Then, the control part 70 reads a correction coefficient α which corresponds to the SOC from the correction data shown in FIG. 13, and corrects the reduction amounts Y of the actual capacities C in the respective months.

A present value of a total reduction amount ΣY is calculated by adding a reduction amount Y after correction to a previous-time value of the total reduction amount ΣY. In this manner, in the embodiment 4, the reduction amount Y of the actual capacity C is corrected corresponding to an SOC. Accordingly, compared to the case where such correction is not performed, the total reduction amount ΣY of the actual capacity C of the secondary batteries 31 can be estimated accurately. An SOC of the secondary batteries 31 can be obtained using a so-called current integration method or an OCV method.

Embodiment 5

Next, the embodiment 5 of the present invention is described with reference to FIG. 14 to FIG. 19.

Figure 14:
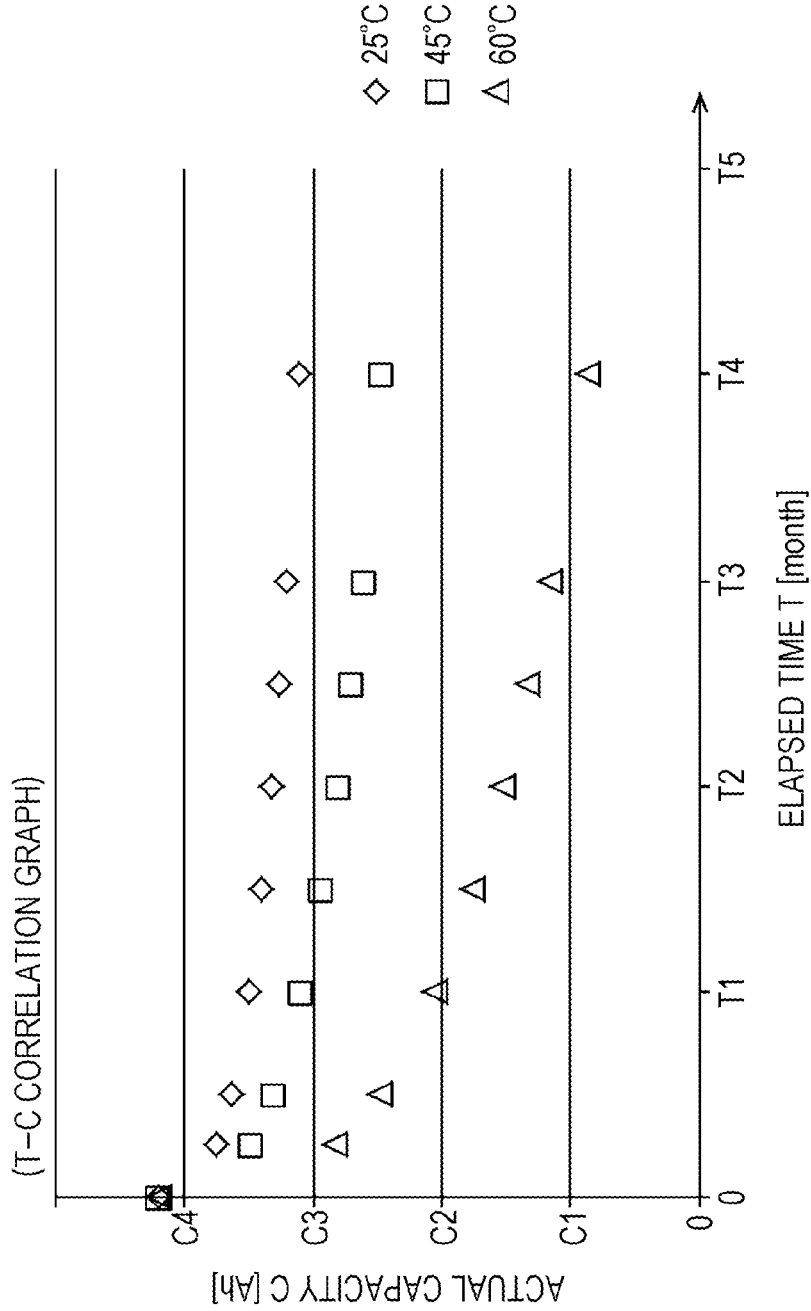
FIG. 14 is a graph showing a transition of an actual capacity at respective battery temperatures in a fifth embodiment.

FIG. 14 is a T-C correlation graph of an iron phosphate based lithium ion secondary battery 31 where an elapsed time T is taken on an axis of abscissas and an actual capacity C is taken on an axis of ordinates. FIG. 14 shows the transition of the actual capacity C with respect to the elapsed time T in three patterns where a battery temperature is set to 25[° C.], 45[° C.] and 60[° C.] respectively. As shown in FIG. 14, although the actual capacity C is lowered with a lapse of time after the manufacture of the battery, even when the elapsed time T is the same, lowering of the capacity is more conspicuous as the battery temperature is increased. That is, the actual capacity C is lowered "in an accelerated manner" as the battery temperature is increased.

Figure 15:
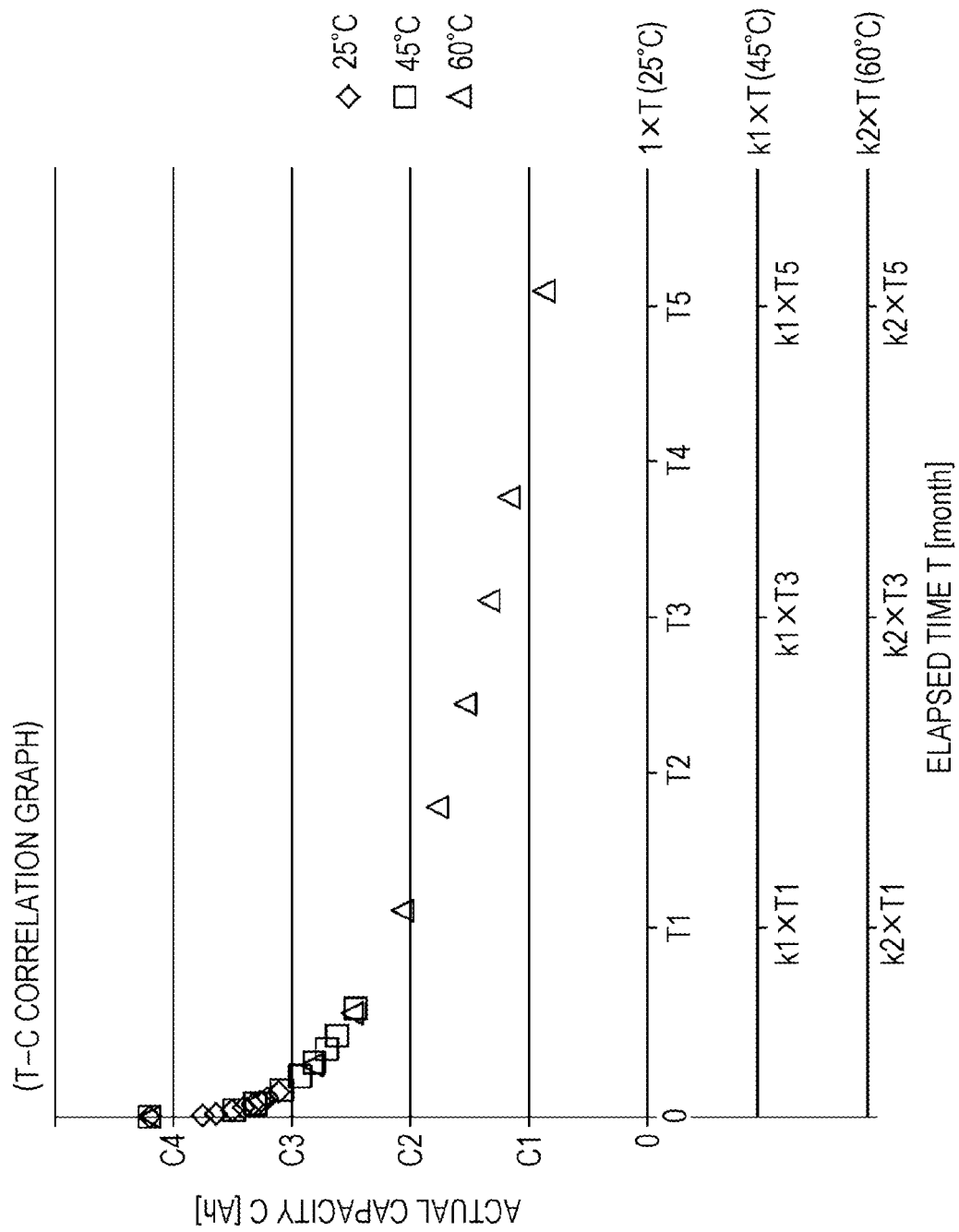
FIG. 15 is a graph showing a transition of an actual capacity at respective battery temperatures when a value taken on an axis of abscissas (time axis) is multiplied by a coefficient.

FIG. 15 is a T-C correlation graph of an iron phosphate based lithium ion secondary battery 31 where an elapsed time T is taken on an axis of abscissas and an actual capacity C is taken on an axis of ordinates. A scale of the axis of abscissas (X axis) is changed for battery temperatures 25[° C.], 45[° C.] and 60[° C.] respectively. To be more specific, using the axis of abscissas at the battery temperature 25[° C.] as the reference, the axis of abscissas at the battery temperature 45[° C.] is set "k1" times as large as the axis of abscissas at the battery temperature 25[° C.], and the axis of abscissas at the battery temperature 60[° C.] is set "k2" times as large as the axis of abscissas at the battery temperature 25[° C.]. In FIG. 15, a magnitude relationship between k1 and k2 is set to k2>k1>1.

As shown in FIG. 15, by multiplying the axis of abscissas (time axis) by the predetermined "coefficient k", even when the battery temperatures differ from each other, the transitions of the actual capacities C substantially agree with each other. This implies that, for example, "1 hour" at the battery temperature 45[° C.] corresponds to "k×1 hour" at the battery temperature 25[° C.]. That is, in the case where the battery temperature is 45[° C.], a reduction amount of the actual capacity C per "1 hour" corresponds to a reduction amount of the actual capacity C per "k×1 hour" when the battery temperature is converted to 25[° C.] from 45[° C.].

The coefficient k for each battery temperature can be calculated by the following method.

(A) A value of N is decided such that an Nth root of an elapsed time T and an actual capacity C at each battery temperature have a proportional relationship.

(B) A straight-line approximation equation of the actual capacity C is decided with respect to each battery temperature.

(C) A ratio M of gradient of the straight-line approximation equation at each battery temperature with respect to a straight line approximation equation at a reference temperature is decided.

(D) The coefficient k is calculated based on values of N and M.

An example of calculating coefficients k at battery temperatures 40[° C.] and 60[° C.] using 25[° C.] as the reference temperature is described hereinafter.

First, correlation between an Nth root of the elapsed time T and the actual capacity C is checked by changing multiplier N, and a value of N which allows the Nth root of the elapsed time T and the actual capacity C to have a proportional relationship at respective battery temperatures 25[° C.], 45[° C.] and 60[° C.] is specified.

Figure 16:
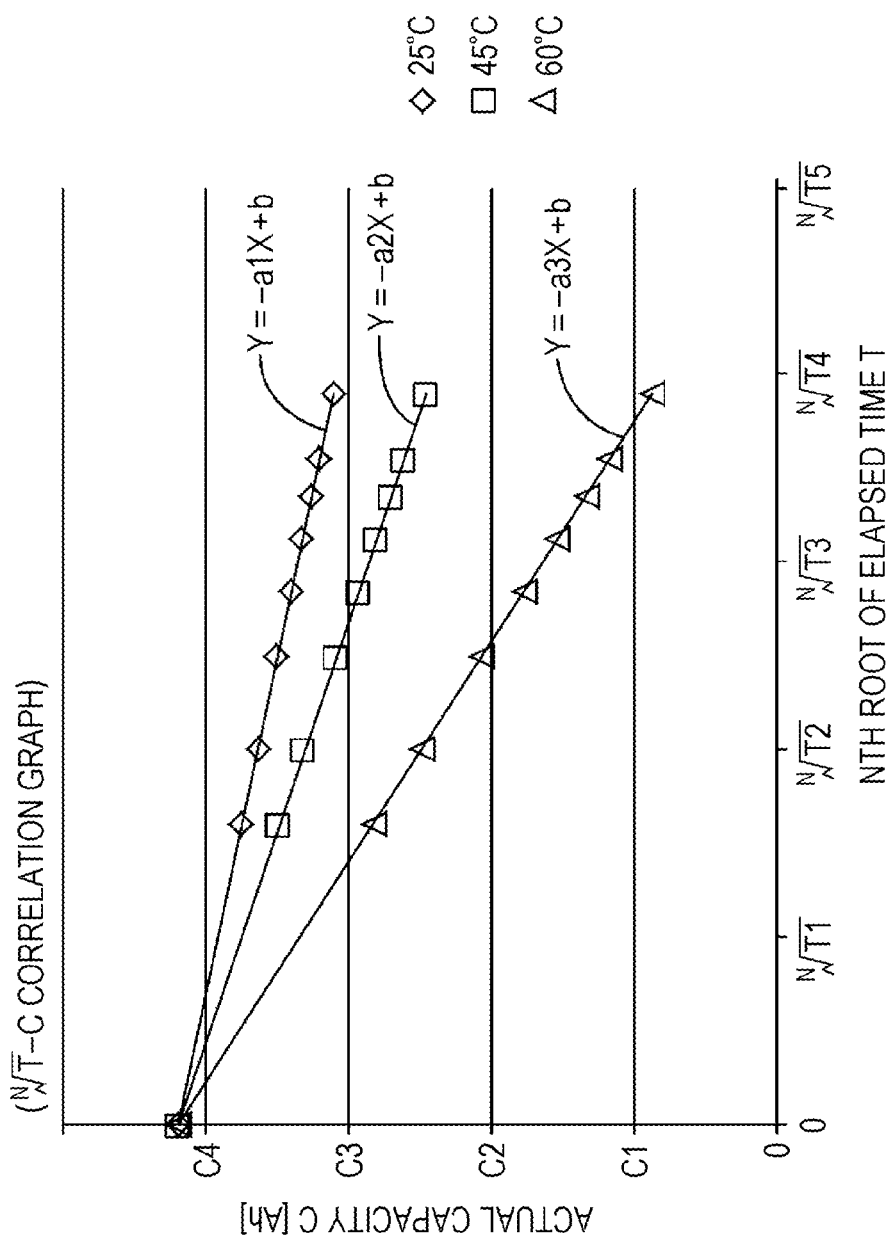
FIG. 16 is a graph showing a transition of an actual capacity at respective battery temperatures when a value taken on an axis of abscissas (time axis) is multiplied by (1/N)th root of an elapsed time T.

FIG. 16 is an $\sqrt[N]{T}$-C correlation graph of an iron phosphate based lithium ion secondary battery 31 where an Nth root of an elapsed time T is taken on an axis of abscissas and an actual capacity C is taken on an axis of ordinates. At respective battery temperatures 25[° C.], 45[° C.] and 60[° C.], the transition of the actual capacity C is indicated by a straight line. A value of N is set to "3.1215" as an example.

From a graph shown in FIG. 16, straight-line approximation equations of the actual capacities C at the respective battery temperatures can be obtained by the following equations.

$$Y = -a1X + b \quad (1)$$

$$Y = -a2X + b \quad (2)$$

$$Y = -a3X + b \quad (3)$$

The equation (1) is the straight-line approximation equation of the actual capacity C at the battery temperature 25[° C.], the equation (2) is the straight-line approximation equation of the actual capacity C at the battery temperature 45[° C.], and the equation (3) is the straight-line approximation equation of the actual capacity C at the battery temperature 60[° C.].

Next, based on the straight line approximation equations (1) to (3), a ratio M of gradient of the straight-line approximation equation at each battery temperature with respect to a straight line approximation equation at a reference temperature is decided.

The ratio M of gradient at each battery temperature is expressed as follows.

$$M1 = a2/a1 \quad (4)$$

$$M2 = a3/a1 \quad (5)$$

Since values of N and M can be obtained from above, coefficients k can be obtained with respect to battery temperatures 45[° C.] and 60[° C.] based on the following equations (6) and (7).

$$k_{45°C.} = M1^N \quad (6)$$

$$k_{60°C.} = M2^N \quad (7)$$

In the embodiment 5, as shown in FIG. 17, values of coefficients k are calculated in advance with respect to the respective battery temperatures, and data on the coefficients k are stored in the memory 73.

The coefficient k is increased as the battery temperature is increased. In this example, 25[° C.] is set as a reference temperature, and the coefficient k is 1 or less when the battery temperature is lower than 25[° C.] and the coefficient k is 1 or more when the battery temperature is higher than 25[° C.]. Accordingly, the coefficients k1 to k0 are set to satisfy a relationship k1<k2<1 and a relationship 1<k3 <k4 . . . k8<k9.

Figure 18:
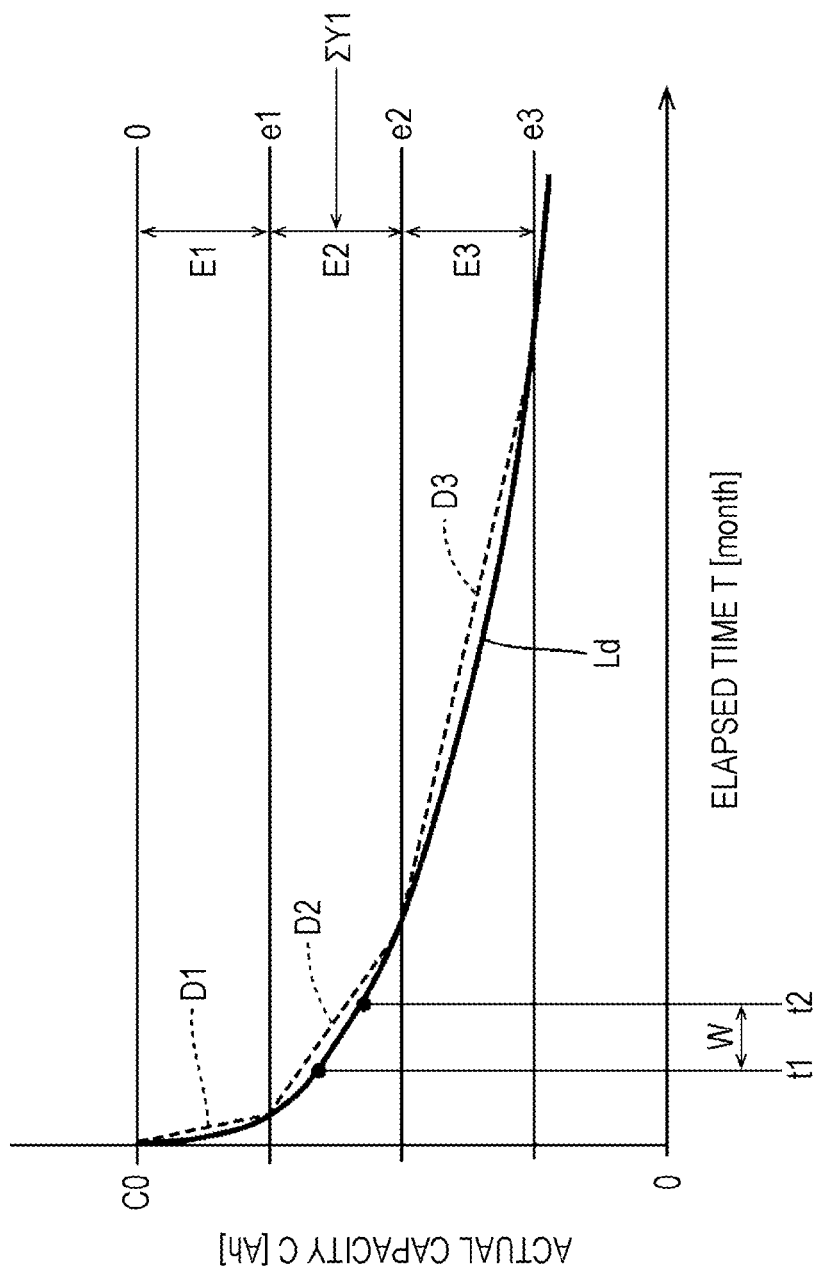
FIG. 18 is a graph showing a transition of an actual capacity at a reference temperature.

FIG. 18 is a T-C correlation graph of an iron phosphate based lithium ion secondary battery 31 An elapsed time T is taken on an axis of abscissas (X axis) and an actual capacity C is taken on an axis of ordinates (Y axis). A capacity change curve Ld indicates the transition of the actual capacity C at the reference temperature 25[° C.].

In the same manner as the embodiments 1 to 4, also in the embodiment 5, the capacity change curve Ld is divided based on a plurality of areas E1 to E3 and is approximated. That is, the capacity change curve Ld is divided and is approximated by three straight lines D1 to D3 which correspond to the respective areas E1 to E3.

In the memory 73, together with data on the coefficients k with respect to the respective battery temperatures, data on gradients d1 to d3 of three approximation straight lines D1 to D3 which divide and approximate the capacity change curve Ld at the reference temperature 25[° C.] are stored (see FIG. 17 and FIG. 19).

In the embodiment 5, the CPU 71 of the control part 70 performs estimation of the actual capacity C through five steps (A) to (E).

(A) Calculate the gradient d of the approximation straight line D at the reference temperature which corresponds to the actual capacity C (B) Calculate the coefficient k which corresponds to the battery temperature (C) Convert a predetermined time W which elapses with the secondary batteries 31 held at the battery temperature into time which elapses with the secondary batteries 31 held at the reference temperature (D) Calculate a reduction amount Yw of the actual capacity C per the predetermined time W at the battery temperature (E) Calculate a total reduction amount ΣY of the actual capacity C Hereinafter, an estimation example of the actual capacity C is described with reference to FIG. 17 to FIG. 19. In this estimation example, it is assumed that an initial value of the actual capacity C, a total reduction amount of the actual capacity at the time of previous estimation (a total reduction amount from the initial value) and the battery temperature satisfy the flowing conditions.

The initial value of the actual capacity C is assumed as C0. It is assumed that the actual capacity C is estimated at a point of time t1 shown in FIG. 18 in the previous time, and a total reduction amount ΣY1 of the actual capacity C at the previous estimation time t1 falls within a range of e1<ΣY1<e2. In the example described hereinafter, it is assumed that a reduction amount Y of the actual capacity C per the predetermined time W is calculated from the previous estimation time t1. Also it is assumed that the battery temperature of the secondary battery 31 detected by the temperature sensor 43 at the predetermined time W is 40[° C.].

The gradient d of the approximation straight line D at the reference temperature which corresponds to the actual capacity C can be obtained from the total reduction amount ΣY1 of the actual capacity C at the previous estimation time t1 and the data shown in FIG. 19. In this example, the total reduction amount ΣY1 at the previous estimation time t1 falls within a range of e1<ΣY1<e2. Accordingly, from data shown in FIG. 19, the approximate straight line at the reference temperature which corresponds to the actual capacity C is D2 and the gradient of the approximate straight line D2 is "d2".

The coefficient k which corresponds to the battery temperature can be obtained by the battery temperature of the secondary batteries 31 measured by the temperature sensor 43 and the data shown in FIG. 17. In this example, the battery temperature at the predetermined time W is 40[° C.] and hence, the coefficient becomes "k5" from FIG. 17.

The time which elapses with the secondary batteries 31 held at the battery temperature corresponds to a time which is obtained by multiplying the time which elapses with the secondary batteries 31 held at the reference temperature by the coefficient k. Accordingly, a conversion time Wt which is obtained by converting the predetermined time W which elapses with the secondary batteries 31 held at the battery temperature into an elapsed time which elapses at the reference temperature is expressed by the following equation (8).

$$Wt = k \times W \quad (8)$$

The gradient d of the approximation straight line D indicates a reduction amount of the actual capacity C per unit time. Accordingly, by multiplying the conversion time Wt by the gradient d of the approximation straight line D, a reduction amount Yw of the actual capacity C per the predetermined time W at the battery temperature can be calculated as expressed by the following equation (9).

$$\text{Reduction amount } Yw \text{ of actual capacity } C = (k \times W) \times d \quad (9)$$

Assuming that the predetermined time W is a unit time (for example, 1 [month]), the reduction amount Yw of the actual capacity C can be expressed by the following equation (10).

$$\text{Reduction amount } Yw \text{ of actual capacity } C = k \times d \quad (10)$$

In the above-mentioned example, the coefficient is "k5" and the gradient of the approximation straight line is "d2" and hence, the reduction amount Yw of the actual capacity C until 1 [month] which is the unit time elapses from the previous estimation time t1 is expressed by "k5"ב"d2".

In this manner, in the case where the predetermined time is the unit time, by multiplying "the gradient d of the approximation straight line D" and "the coefficient k which corresponds to the battery temperature" each other, the reduction amount Yw of the actual capacity C per the predetermined time (unit time) at the battery temperature can be calculated.

Further, by adding the calculated reduction amount Yw of the actual capacity C to the total reduction amount ΣY1 of the actual capacity C at the previous estimation time t1, the total reduction amount ΣY2 of the actual capacity C at a point of time t2 can be calculated. Then, as expressed in the following equation (11), by subtracting the total reduction amount ΣY2 from the initial value C0 of the actual capacity C, the actual capacity C at the point of time t2 can be estimated.

$$C = C0 - \Sigma Y2 \quad (11)$$

The CPU of the control part 70 performs estimation of the actual capacity C by performing the above-mentioned processing each time the predetermined time (unit time) elapses.

In the embodiment 5, it is sufficient to hold the data on the capacity change curve only with respect to the reference temperature and it is unnecessary to hold the data on the capacity change curve at battery temperatures other than the reference temperature. That is, it is unnecessary to store the data on the gradient d of the approximation straight line D shown in FIG. 19 for respective battery temperatures. Accordingly, the number of data to be stored in the memory 73 can be largely reduced and hence, this embodiment 5 is advantageous.

The coefficient k is increased as the battery temperature is increased, and the conversion time Wt is increased as the coefficient k is increased. Accordingly, the reduction amount of the actual capacity is increased as the battery temperature is increased and hence, the reduction amount Yw of the actual capacity C due to a temperature change can be accurately estimated.

The conversion time Wt and the reduction amount Yw of the actual capacity C per the predetermined time can be obtained by a relatively simple arithmetic operation such as multiplication of a coefficient, a predetermined time and a gradient and hence, an arithmetic operation load of the control part 70 is small.

Other Embodiments

The present invention is not limited to the embodiments which have been described with reference to the above-mentioned description and drawings. For example, the following embodiments are also included in the technical scope of the present invention.

(1) In the above-mentioned embodiments 1 to 3, as one example of "energy storage device", the iron phosphate based lithium ion secondary battery is exemplified. However, the present invention is widely applicable to any energy storage device provided that the energy storage device is a lithium ion secondary battery having a characteristic where the transition of a total reduction amount ΣY of the actual capacity C with respect to an elapsed time T follows a square-root law or a predetermined curve. For example, the present invention is also applicable to a ternary lithium ion secondary battery. The ternary lithium ion secondary battery is a battery where a lithium-containing metal oxide which contains elements such as Co, Mn and Ni is used as a positive active material, and graphite, carbon or the like is used as a negative active material.

Further, provided that the energy storage device is a secondary battery having a characteristic where the transition of a total reduction amount ΣY of an actual capacity C with respect to an elapsed time T follows a predetermined curve, the present invention is also applicable to other secondary batteries such as a lead-acid battery, a capacitor or the like.

(2) In the above-mentioned embodiments 1 to 3, the case is exemplified where the capacity change curve La, Lb is divided based on three areas E1 to E3 and is approximated. However, the dividing number for dividing the capacity change curve La is not limited to "3", and may be four or more. The areas E based on which the capacity change curve La is divided are not always necessary to be uniform in range and may be formed nonuniform in range from each other. For example, in a range of the capacity change curve La, Lb where a curve is large, the dividing number is increased by narrowing the areas E based on which the capacity change curve La, Lb is divided, while in a range of the capacity change curve La, Lb where the curve is near a straight line, the dividing number may be decreased by enlarging the areas E based on which the capacity change curve La, Lb is divided.

(3) In the embodiment 1, the case is exemplified where a reduction amount Y of an actual capacity C is obtained for every month after the manufacture of the battery. However, an interval at which the reduction amount Y of the actual capacity C is obtained may be two months or three months.

What is claimed is:

1. A management device which manages an energy storage device, the management device comprising:
    an estimation device for estimating an actual capacity of an energy storage device or, a total reduction amount of the actual capacity, the estimation device comprising: a processor which is configured to:
    calculate the actual capacity or the total reduction amount of the actual capacity by approximation on a plurality of straight lines that connect an upper limit value and a lower limit value of corresponding regions or areas of a capacity change curve indicative of a transition of the actual capacity or a transition of the total reduction amount of the actual capacity with respect to an elapsed time, wherein the capacity change curve is approximated by the plurality of straight lines in a form that the capacity change curve is divided into a plurality of areas;

wherein the management device manages the energy storage device based on the calculated actual capacity or the calculated total reduction amount of the actual capacity, and wherein the capacity change curve comprises a plurality of capacity change curves that indicate the transition of the actual capacity or the transition, of the total reduction amount of the actual capacity at a plurality of temperatures, respectively.

2. The management device according to claim 1, wherein the plurality of areas formed by dividing the capacity change curve are areas obtained by partitioning the actual capacity or the total reduction amount of the actual capacity by a predetermined value.

3. The management device according to claim 1, wherein the processor calculates the actual capacity or the total reduction amount of the actual capacity of the capacity change curves which correspond to the respective temperatures are approximated by the plurality of straight lines.

4. The management device according to claim 3, wherein a gradient of a straight line of the straight lines which approximates the capacity change curve expresses a reduction amount of the actual capacity per unit time, and wherein the estimation device further comprises:
a memory part which holds a capacity reduction amount map expressing the reduction amount of the actual capacity per unit time with respect to respective areas obtained by dividing the capacity change curve and the respective temperatures.

5. The management device according to claim 4, wherein the processor is configured to calculate the reduction amount of the actual capacity per a predetermined time based on data on a temperature of the energy storage device and the capacity reduction amount map each time the predetermined time elapses after the manufacture of the energy storage device, and is configured to calculate a present value of the actual capacity by subtracting the reduction amount of the actual capacity per the predetermined time from a previous-time value of the actual capacity or is configured to calculate a present value of the total reduction amount of the actual capacity by adding the reduction amount of the actual capacity per the predetermined time to a previous-time value of the total reduction amount of the actual capacity.

6. The management device according to claim 3, wherein a gradient of a straight line of the straight lines which approximates the capacity change curve expresses a reduction amount of the actual capacity per unit time, and wherein the estimation device includes a memory part which holds:
first data indicative of a ratio of the reduction amount of the actual capacity per unit time of the respective areas formed by dividing the capacity change curve; and
second data indicative of the reduction amount of the actual capacity per unit time for respective temperatures in one region formed by dividing the capacity change curve.

7. The management device according to claim 6, wherein the processor calculates the reduction amount of the actual capacity device per a predetermined time based on data on a temperature of the energy storage device, the first data and the second data each time a predetermined time elapses after the manufacture of the energy storage device, and calculates a present value of the actual capacity by subtracting the reduction amount of the actual capacity per the predetermined time from a previous-time value of the actual capacity or calculates a present value of the total reduction amount of the actual capacity by adding the reduction amount of the actual capacity per the predetermined time to a previous-time value of the total reduction amount of the actual capacity.

8. The management device according to claim 4, wherein the processor corrects data on the reduction amount of the actual capacity per unit time based on an SOC of the energy storage device.

9. The management device according to claim 2, wherein based on gradients of the plurality of straight lines which approximate the capacity change curve of the energy storage device at a reference temperature, a temperature of the energy storage device, and a conversion time obtained by converting a time which elapses with the energy storage device held at the temperature into a time which elapses with the energy storage device held at the reference temperature, the processor calculates a reduction amount of the actual capacity per the time at the temperature.

10. The management device according to claim 9, wherein the higher the temperature of the energy storage device, the longer the conversion time becomes.

11. The management device according to claim 9, wherein the processor calculates the conversion time by multiplying the time which elapses with the energy storage device held at the temperature by a coefficient which corresponds to the temperature.

12. The management device according to claim 1, wherein the plurality of straight lines correspond to a plurality of sections of the plurality of capacity change curves, respectively, and wherein the estimation device further comprises:
a memory part which holds a capacity reduction amount map including a plurality of gradients for the plurality of straight lines in the plurality of sections at the plurality of temperatures.

13. A management method of managing an energy storage device, the management method comprising:
estimating an actual capacity of an energy storage device or a total reduction amount of the actual capacity,
wherein the estimating of the actual capacity of the energy storage device or the total reduction amount of the actual capacity comprises calculating the actual capacity or the total reduction amount of the actual capacity by approximation on a plurality of straight lines that connect an upper limit value and a lower limit value of corresponding regions or areas of a capacity change curve indicative of a transition of the actual capacity or a transition of the total reduction amount of the actual capacity with respect to an elapsed time,
wherein the capacity change curve is approximated by the plurality of straight lines in a form that the capacity change curve is divided into a plurality of areas; and wherein
the capacity change curve comprises a plurality of capacity change curves that indicate the transition of the actual capacity or the transition of the total reduction amount of the actual capacity at a plurality of temperatures, respectively.

14. A management device for a battery module, the management device comprising:

an estimation device for estimating an actual capacity of an energy storage device or a total reduction of the actual capacity, the estimation device comprising:

a memory which stores data on a plurality of straight lines that connect an upper limit value and a lower limit value of corresponding regions or areas of a capacity change curve indicating the actual capacity or the total reduction in the actual capacity over an elapsed time;

wherein the capacity change curve is approximated by the plurality of straight lines in a form that the capacity change curve is divided into a plurality of areas; and a processor which calculates the actual capacity or the total reduction amount of the actual capacity by approximation on the plurality of straight lines, wherein the management device manages the energy storage device based on the calculated actual capacity or the calculated total reduction amount of the actual capacity, and wherein the capacity change curve comprises a plurality of capacity change curves that indicate a transition of the actual capacity or a transition of the total reduction amount of the actual capacity at a plurality of temperatures, respectively.

15. The management device of claim 14, wherein the memory further stores a capacity reduction amount map expressing a reduction amount of the actual capacity per unit time for a plurality of ranges of the total reduction of the actual capacity.

16. The management device of claim 15, wherein a slope of a straight line of the Straight lines in the straight line approximation expresses the reduction amount of the actual capacity per unit time for a range of the plurality of ranges of the total reduction amount of the actual capacity.

17. The management device of claim 16, wherein the slope of the straight line comprises a constant slope within an entirety of the range of the total reduction amount of the actual capacity.

18. The management device of claim 16, wherein data in the capacity reduction amount map comprises the slope of the straight line for the plurality of capacity change curves at the plurality of temperatures in the plurality of ranges of the total reduction of the actual capacity.

* * * * *